(12) United States Patent
Wang

(10) Patent No.: US 11,374,199 B2
(45) Date of Patent: Jun. 28, 2022

(54) DISPLAY PANEL AND DISPLAY DEVICE HAVING THROUGH HOLE SURROUNDING BARRIER AREA

(71) Applicant: WUHAN CHINA STAR OPTOELECTRONICS SEMICONDUCTOR DISPLAY TECHNOLOGY CO., LTD., Hubei (CN)

(72) Inventor: Guochao Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 24 days.

(21) Appl. No.: 16/754,377

(22) PCT Filed: Dec. 20, 2019

(86) PCT No.: PCT/CN2019/126821
§ 371 (c)(1),
(2) Date: Apr. 8, 2020

(87) PCT Pub. No.: WO2021/062951
PCT Pub. Date: Apr. 8, 2021

(65) Prior Publication Data
US 2021/0193957 A1 Jun. 24, 2021

(30) Foreign Application Priority Data
Sep. 30, 2019 (CN) .......................... 201910938061.5

(51) Int. Cl.
*H01L 51/52* (2006.01)
*H01L 27/32* (2006.01)

(52) U.S. Cl.
CPC ...... *H01L 51/5253* (2013.01); *H01L 27/3234* (2013.01); *H01L 27/3246* (2013.01); *H01L 2251/301* (2013.01); *H01L 2251/303* (2013.01)

(58) Field of Classification Search
CPC ............. H01L 51/5253; H01L 27/3234; H01L 27/3246; H01L 2251/301
See application file for complete search history.

(56) References Cited

U.S. PATENT DOCUMENTS 9,905,629 B2 * 2/2018 Kim ..................... H01L 27/3258
10,135,025 B2 * 11/2018 Kim ..................... H01L 51/5253
(Continued)

FOREIGN PATENT DOCUMENTS

| CN | 110265471 A | 9/2019 |
| CN | 110265583 A | 9/2019 |

*Primary Examiner* — Ida M Soward
(74) *Attorney, Agent, or Firm* — Mark M. Friedman

(57) ABSTRACT

A display panel and a display device are provided. Moisture and oxygen can be effectively prevented from passing through an organic light emitting layer in a barrier area and entering the organic light emitting layer in a display area of the display panel by disposing the barrier area having a plurality of trenches between the display area and a through hole and forming a blocking structure through disposing a barrier block between adjacent trenches. In addition, the trenches can be set into a wavy shape, which can increase an area of the trenches and further increase a surface area of a packaging layer in the barrier area, so that intrusion of moisture and oxygen can be effectively blocked, thereby protecting the display area and improving stability of the display device.

15 Claims, 3 Drawing Sheets

(56) References Cited

U.S. PATENT DOCUMENTS

| | | | |
|---|---|---|---|
| 10,205,122 B2 * | 2/2019 | Choi | H01L 51/0096 |
| 10,454,067 B2 * | 10/2019 | Seo | H01L 27/3227 |
| 10,541,380 B1 * | 1/2020 | Sung | H01L 51/0097 |
| 10,553,819 B2 * | 2/2020 | Kim | H01L 27/3246 |
| 10,566,394 B2 * | 2/2020 | Cai | H01L 51/5253 |
| 10,609,826 B2 * | 3/2020 | Choi | G06F 1/1626 |
| 10,615,369 B2 * | 4/2020 | Choi | H01L 27/3262 |
| 10,673,020 B2 * | 6/2020 | Kim | H01L 27/3244 |
| 10,741,788 B2 * | 8/2020 | Won | H01L 51/5256 |
| 10,840,478 B2 * | 11/2020 | Han | H01L 27/3276 |
| 10,862,068 B2 * | 12/2020 | Choi | H01L 51/5253 |
| 10,903,293 B2 * | 1/2021 | Jeong | H01L 27/323 |
| 10,957,874 B2 * | 3/2021 | Kim | H01L 27/3246 |
| 10,978,526 B2 * | 4/2021 | Qin | H01L 27/3246 |
| 10,978,672 B2 * | 4/2021 | Lee | H01L 27/326 |
| 11,075,362 B2 * | 7/2021 | Seo | H01L 51/5271 |
| 2019/0081273 A1 * | 3/2019 | Sung | H01L 51/5253 |
| 2019/0252645 A1 | 8/2019 | Kim et al. | |
| 2019/0334120 A1 * | 10/2019 | Seo | H01L 51/5246 |
| 2019/0355930 A1 * | 11/2019 | Lee | H01L 51/5253 |
| 2020/0119304 A1 * | 4/2020 | Choi | H01L 51/5237 |
| 2020/0142525 A1 * | 5/2020 | Han | G06F 1/1643 |
| 2020/0144535 A1 * | 5/2020 | Kim | H01L 51/5256 |
| 2020/0161582 A1 * | 5/2020 | Choi | H01L 27/326 |
| 2020/0175900 A1 * | 6/2020 | Han | H01L 51/0031 |
| 2020/0176538 A1 * | 6/2020 | Um | H01L 27/3272 |
| 2020/0235180 A1 * | 7/2020 | Park | H01L 27/3276 |
| 2020/0259121 A1 * | 8/2020 | Lee | H01L 51/5253 |
| 2020/0313101 A1 * | 10/2020 | Jung | H01L 27/3244 |
| 2021/0151715 A1 * | 5/2021 | Lee | H01L 27/3246 |
| 2021/0208761 A1 * | 7/2021 | Park | G06F 3/044 |
| 2021/0234122 A1 * | 7/2021 | Choi | H01L 51/56 |

* cited by examiner

DISPLAY PANEL AND DISPLAY DEVICE HAVING THROUGH HOLE SURROUNDING BARRIER AREA

FIELD OF INVENTION

The present invention relates to the field of display technology, and more particularly to a display panel and a display device.

BACKGROUND

Following a release of notch screens, water-drop notch screens, V-notch screens, lifting structures, and push-pull structures, under-screen camera will undoubtedly push an industrial design of full screens to a new high, which will become a most mature and widely used full-screen solution in present day mobile phone market.

SUMMARY

Existing under-screen cameras are divided into through-hole type cameras and blind-hole type cameras. A key technical problem of the through-hole type cameras is how to solve a packaging problem around a through hole, otherwise moisture and oxygen will intrude a display area along the through hole. Generally, in the prior art, a part of an organic light emitting layer around the through-hole is etched, but its implementation cost is very high, and a laser device needs to be added to an equipment for evaporation deposition, which is difficult to achieve with current equipment.

Therefore, a display panel is needed to prevent moisture and oxygen from entering a functional area of the display panel through the through hole of a camera area under the screen, thereby improving a stability of the display panel.

In order to solve the above technical problems, the present invention provides a display panel and a display device. Moisture and oxygen can be effectively prevented from entering a display area of the display panel by disposing a barrier area having a plurality of trenches between the display area and a through hole and forming a blocking structure through disposing a barrier block between adjacent trenches.

The present invention provides a display panel, comprising a display area, a through hole, and a barrier area, wherein the barrier area surrounds the through hole, the display area surrounds the barrier area, and the through hole penetrates the display panel; wherein the display panel comprises a substrate, an inorganic insulating layer, an organic light emitting layer, and a packaging layer, and the inorganic insulating layer is disposed on the substrate; and wherein at least one trench is disposed over the substrate in the barrier area, the trench surrounds the through hole, and there is a gap between adjacent trenches, the inorganic insulating layer in the barrier area comprises a plurality of barrier blocks disposed between the trench and the through hole, and between adjacent trenches.

Furthermore, the organic light emitting layer is disposed on the barrier blocks and the bottom of the trench in the barrier area, and the packaging layer is disposed on the organic light emitting layer and the trench not covered by the organic light emitting layer.

Furthermore, the trench comprises an intermittent trench and a continuous trench, and the continuous trench and the intermittent trench are disposed around the through hole in an interleaving manner.

Furthermore, the intermittent trench comprises first and second portions disposed alternately; and the second portions of the adjacent intermittent trenches correspond to each other, and a length of the first portions of the intermittent trenches away from the through holes is greater than a length of the first portions of the intermittent trenches close to the through holes.

Furthermore, the trench comprises a cross-sectional shape of arc or square; and/or the barrier block comprises a cross-sectional shape of triangle, square or trapezoid.

Furthermore, a material of the barrier blocks comprises silicon oxide or silicon nitride; and/or a material of the substrate is polyimide.

Furthermore, a shape of the trench in a plan view is linear or wavy-shaped.

Furthermore, a dam is further disposed between the barrier area and the display area, and the dam is disposed on a barrier block close to the display area.

Furthermore, in the display area, the display panel further comprises a thin film transistor layer disposed on a side of the inorganic insulating layer away from the substrate; a first electrode disposed on a side of the thin film transistor layer away from the inorganic insulating layer and connected to the thin film transistor layer; and a pixel defining layer disposed on the first electrode and the thin film transistor layer, wherein the pixel defining layer has an opening, and the first electrode is exposed in the opening; and the organic light emitting layer is disposed on the first electrode; and the first electrode is electrically connected to the thin film transistor layer.

The present invention further provides a display device comprising the display panel described above and a camera module, and the camera module is disposed under the display panel and corresponds to the through hole.

The present invention provides a display panel and a display device. Moisture and oxygen can be effectively prevented from passing through an organic light emitting layer in a barrier area and entering the organic light emitting layer in a display area of the display panel by disposing the barrier area having a plurality of trenches between the display area and a through hole and forming a blocking structure through disposing a barrier block between adjacent trenches. In addition, the trenches can be set into a wave shape, which can increase an area of the trenches and further increase a surface area of a packaging layer in the barrier area, so that intrusion of moisture and oxygen can be effectively blocked, thereby protecting the display area and improving stability of the display device.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

Figure 1:
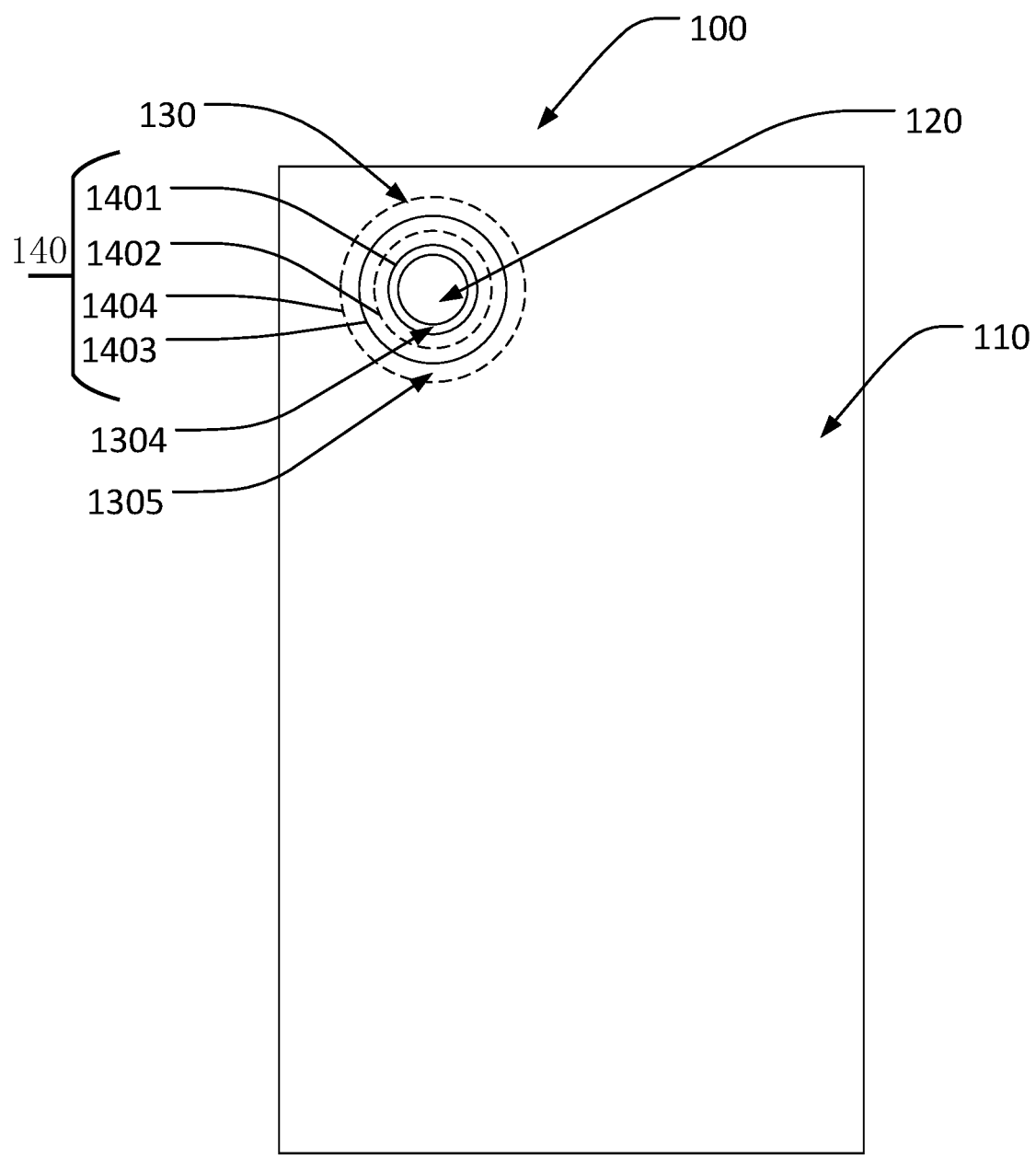
FIG. 1 is a plan view of a display panel according to the present invention.

The reference numerals in the above drawings are:

DETAILED DESCRIPTION

The following is a description of each embodiment with reference to additional drawings to illustrate specific embodiments in which the present invention can be implemented. The directional terms mentioned in the present invention, such as up, down, front, back, left, right, inside, outside, side, etc., are only directions referring to the drawings. The names of the elements mentioned in the present invention, such as first, second, etc., are only used to distinguish different components, which can be better expressed. In the figure, similarly structured units are denoted by the same reference numerals.

As shown in FIG. 1, the present invention provides a display panel 100, comprising a display area 110, a through hole 120, and a barrier area 130. The barrier area 130 surrounds the through hole 120, and the display area 110 surrounds the barrier area 130. The through hole 120 penetrates the display panel 100.

An area corresponding to the through hole 120 is used to dispose an electronic device, and a camera may be disposed therein. The barrier area 130 is used to block moisture and oxygen at the through hole 120 from entering the display area, thereby protecting functional devices in the display area 110 of the display panel 100.

Figure 2:
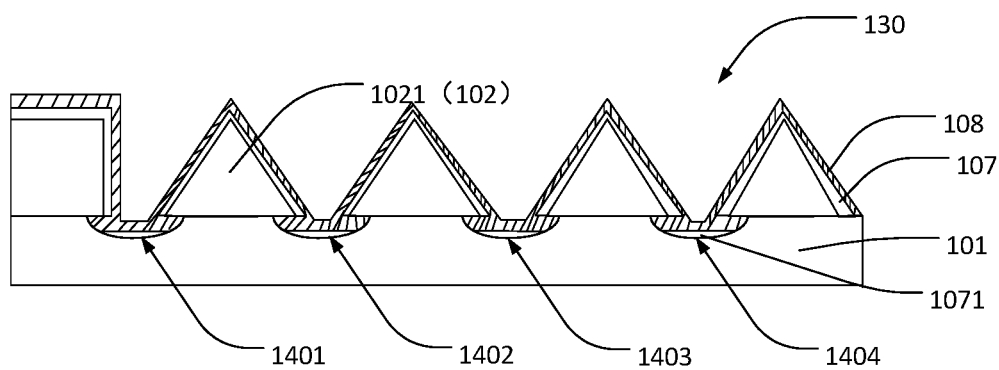
FIG. 2 is a schematic structural diagram of a triangular barrier block of a display panel according to the present invention.
Figure 3:
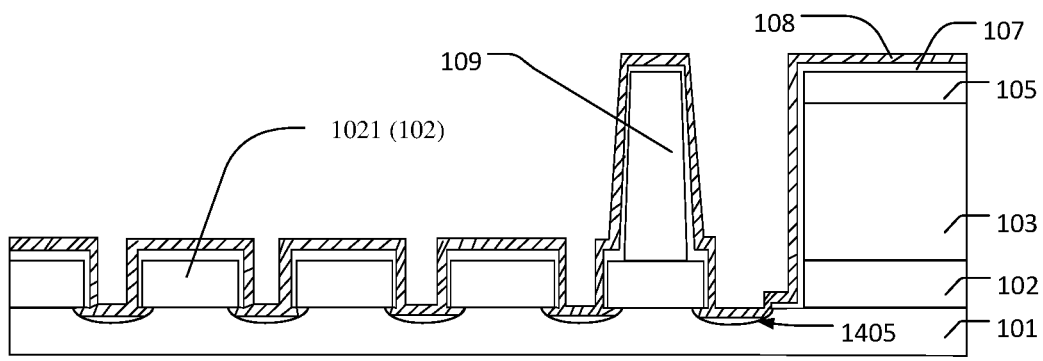
FIG. 3 is a schematic structural diagram of a square barrier block of a display panel according to the present invention.

As shown in FIGS. 2 and 3, the display panel 100 comprises a substrate 101, an inorganic insulating layer 102, a thin film transistor layer 103, a pixel defining layer 105, an organic light emitting layer 107, and a packaging layer 108. The inorganic insulating layer 102 is disposed on the substrate 101.

Please refer to FIG. 1 and FIG. 2 at the same time, in the barrier area 130, a plurality of trenches 140 are disposed on the substrate 101, and the trenches 140 surround the through hole 120. In this embodiment, a number of the trenches 140 of the present invention is four, and the present invention does not limit the number of the trenches 140. A first gap 1304 is formed between the trench 140 near the through hole 120 and the through hole 120. The trenches 140 are formed by etching the substrate 101 in the barrier area 130.

The inorganic insulating layer 102 comprises a plurality of barrier blocks 1021, corresponding to a gap 1305 and the first gap 1304 adjacent to the trenches. The organic light emitting layer 107 is attached to a bottom of the trenches 140 and the barrier blocks 1021. The barrier blocks 1021 form a corresponding pattern by exposing and developing the inorganic insulating layer 102 in the barrier area 130.

A cross-sectional shape of the trenches 140 comprises an arc shape or a square shape, and preferably is an arc shape in the present invention. A cross-sectional shape of the barrier blocks 1021 comprises a triangular shape or a square shape (refer to 1021 in FIG. 2). The shape in this embodiment is preferably a square shape, or can be fabricated in a trapezoidal shape, and the shape of the barrier block 1021 near the through hole 120 is a square shape (refer to 1021 in FIG. 3).

A shape of the trenches 140 in a plan view is linear or wavy. Specifically, it means that a bottom of the trenches 140 is horizontal or wavy as a whole, that is, the bottom of the trenches is located on a same horizontal plane. The trenches 140 have a waveform distribution, which increases a length of the trenches 140, that is, increases an effective barrier surface of the barrier area 130.

In the barrier area 130, the organic light-emitting layer 107 is disposed on a blocking mechanism of the present invention. Due to a complicated structure of the blocking mechanism, the organic light-emitting layer 107 has uneven distribution, and there are fluctuations in the trenches 140. The organic light emitting layer 107 in the trenches 140 is disconnected, which can effectively block a transfer of moisture and oxygen in the organic light emitting layer 107, thereby protecting the functional devices in the display area.

Therefore, in the present invention, the barrier area 130 is disposed around the through hole 120, the trenches 140 are formed on the substrate 101 of the barrier area 130, and the barrier blocks 1021 are formed in the inorganic insulating layer 102. This barrier structure can prevent moisture and oxygen from being transferred to the organic light emitting layer 107 in the display area 110.

When forming the organic light emitting layer 107 by vapor deposition, there is no continuous organic light emitting layer 107 formed in the trenches of the present invention. The organic light emitting layer 107 is disconnected at the trenches 140 and portions of the organic light emitting layer 1071 is formed at the bottom of the trenches 140.

The packaging layer 108 is disposed on the organic light emitting layer 107 and portions of the trench 140. Specifically, the packaging layer 108 fills the disconnected area between the organic light emitting layer at the bottom of the trench 140 and the organic light emitting layer on the barrier block area, and covers the organic light emitting layer 107 in the barrier block area. Furthermore, the transmission of moisture and oxygen between the organic light emitting layers 107 is blocked, and moisture and oxygen can be prevented from intruding the organic light emitting layer 107 of the display area 110 from above the barrier area 130 of the present invention.

As shown in FIG. 3, a dam 109 is further provided at a connection between the barrier area 130 and the display area 110. A trench is disposed between the dam 109 and the display area 110 (marked as 1405 in FIG. 3). The dam 109 is disposed on a barrier block close to the display area 110. The dam 109 is formed by exposing and developing the thin film transistor layer 103 and the pixel defining layer 105, and can effectively block the moisture of the through hole. The organic light emitting layer 107 and the packaging layer 108 also cover the dam and the trenches at the connection (marked as 1205 in FIG. 3).

A material of the barrier block 1021 comprises silicon oxide or silicon nitride, and a material of the substrate 101 is polyimide.

The trenches 140 comprise an intermittent trench 1402 and a continuous trench 1401. The intermittent trench 1402 and a continuous trench 1401 surround the through hole 120 and are arranged in an interleaving manner.

The trenches according to the present invention comprise three continuous trenches 1401, 1403, and 1045, and two intermittent trenches 1402, and 1404.

The intermittent trench comprises first and second portions arranged alternately. The second portions of adjacent intermittent trenches correspond to each other, and a length of the first portions of the intermittent trenches away from the through hole is greater than a length of the first portions of the intermittent trenches close to the through hole.

Specifically, the intermittent trenches 1402 and 1404 are alternately formed by a plurality of first portions (i.e. small trenches), and the second portions are formed between the adjacent first portions (i.e. voids between the small trenches). The second portions are unetched portions of the substrate in the barrier area.

Figure 4:
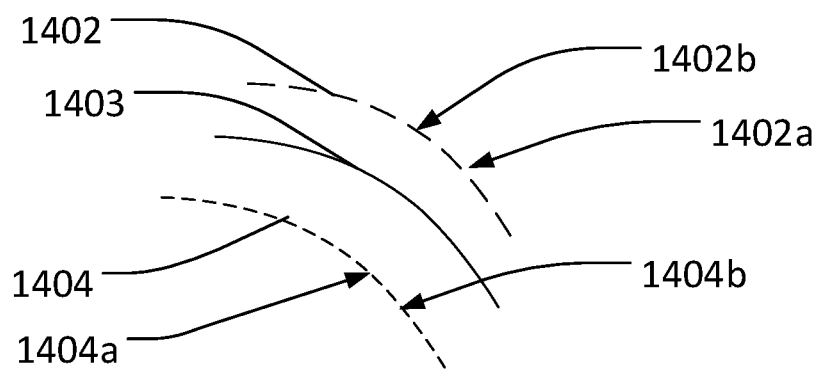
FIG. 4 is a partially enlarged view of a trench distribution according to an embodiment according to the present invention.

As shown in FIG. 4, the two intermittent trenches 1402 and 1404 are disposed with a continuous trench 1403 in the middle, wherein the second portion 1402a of the intermittent trench 1402 corresponds to the second portion 1404a of the intermittent trenches 1404. The length of the first portion 1402b of the intermittent trench 1402 is greater than the length of the first portion 1404b of the intermittent trench 1404. A barrier block 1021 of the barrier structure is provided between the first portion 1402b of the intermittent trench 1401 and the continuous trench 1403, and there is no barrier structure disposed between the second portion 1402b of the intermittent trench 1402 and the continuous trench 1403.

Figure 5:
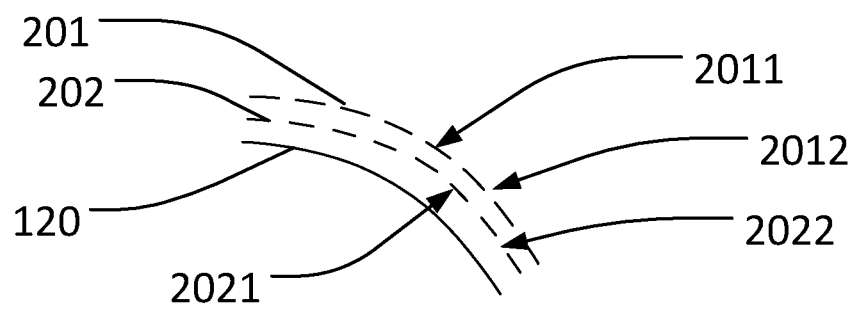
FIG. 5 is a partially enlarged view of a trench distribution according to another embodiment of the present invention.

As shown in FIG. 5, in another embodiment, intermittent trenches of the present invention may also be directly adjacent with each other, without a continuous trench disposed in the middle. Specifically, an intermittent trench 201 is disposed on a periphery of the through hole 120. A second portion 2012 of the intermittent trench 201 corresponds to a second portion 2022 of an intermittent trench 202, and a length of a first portion 2011 of the intermittent trench 201 is greater than a length of a first portion 2021 of the intermittent trench 202.

In the present invention, moisture and oxygen can be effectively prevented from entering the display area 110 of the display panel 100 by disposing the barrier area 130 between the display area 110 and the through hole 120. The barrier area 130 has a plurality of trenches, and the barrier blocks 1021 are disposed between adjacent trenches to form a barrier structure. In addition, the trenches are disposed in the barrier area 130 in an alternating manner, which further blocks moisture and oxygen, thereby protecting the display area 110 and ultimately improving the stability of the display panel 100.

Figure 6:
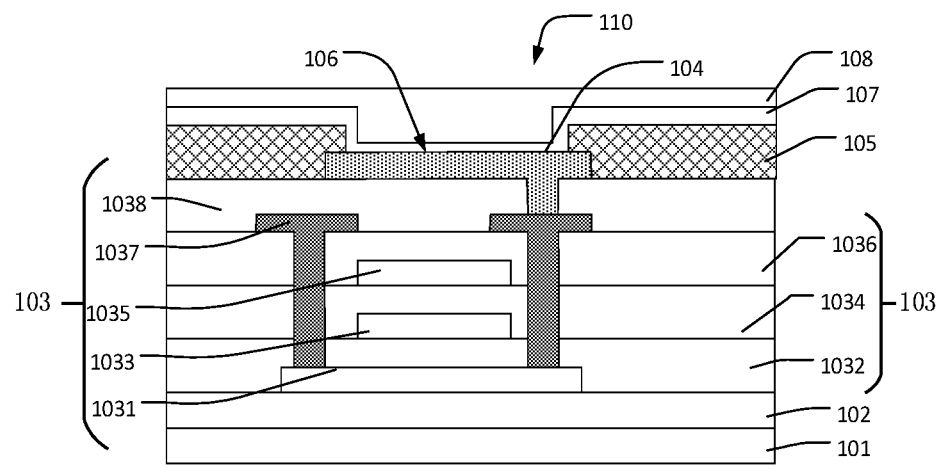
FIG. 6 is a schematic structural diagram of a display area of a display panel according to the present invention.

As shown in FIG. 6, in the display area 110, the display panel 100 further comprises a first electrode 104.

The thin film transistor layer 103 is disposed on a side of the inorganic insulating layer 102 away from the substrate 101.

The thin film transistor layer 103 comprises a semiconductor layer 1031, a first gate insulating layer 1032, a first gate 1033, a second gate insulating layer 1034, a second gate 1035, an interlayer insulating layer 1036, a third metal layer 1037, and a planarization layer 1038.

The semiconductor layer 1031 is disposed on the inorganic insulating layer 102 at a side away from the substrate 101. A material of the semiconductor layer 1031 is polysilicon or single crystal silicon.

The first gate insulating layer 1032 is disposed on the inorganic insulating layer 102 and the semiconductor layer 1031. The first gate insulating layer 1032 mainly insulates adjacent metal layers and prevents functions thereof from being affected.

The first gate electrode 1033 is disposed on the first gate insulating layer 1032 at a side away from the inorganic insulating layer 102. The second gate insulating layer 1034 is disposed on the first gate 1033 and the first gate insulating layer 1032. The second gate 1035 is disposed on the second gate insulating layer 1034 at a side away from the first gate insulating layer 1032.

The interlayer insulating layer 1036 is disposed on the second gate insulating layer 1034 and the second gate 1035. The third metal layer 1037 is disposed on the interlayer insulating layer 1036 at a side away from the second gate insulating layer 1034.

The planarization layer 1038 is disposed on the third metal layer 1037 and the interlayer insulating layer 1036.

The first electrode 104 is disposed on a side of the thin film transistor layer 103 away from the inorganic insulating layer 102 and is connected to the thin film transistor layer 103.

The pixel defining layer 105 is disposed on the first electrode 104 and the thin film transistor layer 103. The pixel defining layer 105 has an opening 106, and the first electrode 104 is partially exposed in the opening 106. The organic light emitting layer 107 is disposed on the first electrode 104.

The present invention further provides a display device comprising the display panel 100 and a camera module, and the camera module is disposed under the display panel 100 and corresponds to the through hole 120.

In the display device, the barrier area 130 is disposed between the display region 110 and the through hole 120. The barrier area has a plurality of trenches, and barrier blocks 1021 are disposed between adjacent trenches to form a barrier structure. This can effectively prevent moisture and oxygen from passing through the organic light emitting layer 107 in the barrier area 130 and intruding the organic light emitting layer 107 in the display area 110 of the display panel 100. Moreover, the trenches can be formed with a wavy shape, which can increase areas of the trenches and further increases a surface area of the packaging layer 108. The area of the barrier area 130 can effectively prevent moisture and oxygen from entering, thereby protecting the display area 110. Finally, the stability of the display device is improved.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel, comprising a display area, a through hole, and a barrier area, wherein the barrier area surrounds the through hole, the display area surrounds the barrier area, and the through hole penetrates the display panel;

wherein the display panel comprises a substrate, an inorganic insulating layer, an organic light emitting layer, and a packaging layer, and the inorganic insulating layer is disposed on the substrate;

wherein at least one trench is disposed in the substrate in the barrier area, the trench surrounds the through hole, there is a gap between adjacent trenches, and the inorganic insulating layer in the barrier area comprises a plurality of barrier blocks disposed between the trench and the through hole, and between the adjacent trenches; and wherein the organic light emitting layer is disposed on the barrier blocks and a bottom of the trench in the barrier area, and the packaging layer is disposed on the organic light emitting layer disposed on the barrier blocks and the trench not covered by the organic light emitting layer disposed on the bottom of the trench.

2. The display panel according to claim 1, wherein the trench comprises an intermittent trench and a continuous trench, and the continuous trench and the intermittent trench are disposed around the through hole in an interleaving manner.

3. The display panel according to claim 2, wherein the intermittent trench comprises first and second portions disposed alternately; and the second portions of adjacent intermittent trenches correspond to each other, and a length of the first portions of intermittent trenches away from the through hole is greater than a length of the first portions of intermittent trenches close to the through hole.

4. The display panel according to claim 1, wherein a dam is further disposed between the barrier area and the display area, and the dam is disposed on a barrier block close to the display area.

5. The display panel according to claim 1, wherein the trench has a cross-sectional shape that is arc or square; and/or the barrier blocks comprise a cross-sectional shape that is triangular, square, or trapezoidal.

6. The display panel according to claim 1, wherein a material of the barrier blocks comprises silicon oxide or silicon nitride; and/or a material of the substrate is polyimide.

7. The display panel according to claim 1, wherein a shape of the trench in a plan view is linear or wavy.

8. The display panel according to claim 1, wherein in the display area, the display panel further comprises:

a thin film transistor layer disposed on a side of the inorganic insulating layer away from the substrate;

a first electrode disposed on a side of the thin film transistor layer away from the inorganic insulating layer and connected to the thin film transistor layer;

a pixel defining layer disposed on the first electrode and the thin film transistor layer;

wherein the pixel defining layer has an opening, and the first electrode is exposed in the opening; and the organic light emitting layer disposed on the first electrode;

wherein the first electrode is electrically connected to the thin film transistor layer.

9. A display device, comprising a display panel, wherein the display panel comprises a display area, a through hole, and a barrier area, wherein the barrier area surrounds the through hole, the display area surrounds the barrier area, and the through hole penetrates the display panel;

wherein the display panel comprises a substrate, an inorganic insulating layer, an organic light emitting layer, and a packaging layer, and the inorganic insulating layer is disposed on the substrate;

wherein at least one trench is disposed in the substrate in the barrier area, the trench surrounds the through hole, there is a gap between adjacent trenches, and the inorganic insulating layer in the barrier area comprises a plurality of barrier blocks disposed between the trench and the through hole, and between the adjacent trenches; and wherein the organic light emitting layer is disposed on the barrier blocks and a bottom of the trench in the barrier area, and the packaging layer is disposed on the organic light emitting layer disposed on the barrier blocks and the trench not covered by the organic light emitting layer disposed on the bottom of the trench.

10. The display device according to claim 9, wherein the trench comprises an intermittent trench and a continuous trench, and the continuous trench and the intermittent trench are disposed around the through hole in an interleaving manner.

11. The display device according to claim 10, wherein the intermittent trench comprises first and second portions disposed alternately; and the second portions of adjacent intermittent trenches correspond to each other, and a length of the first portions of intermittent trenches away from the through hole is greater than a length of the first portions of intermittent trenches close to the through hole.

12. The display device according to claim 9, wherein a dam is further disposed between the barrier area and the display area, and the dam is disposed on a barrier block close to the display area.

13. The display device according to claim 9, wherein the trench has a cross-sectional shape that is arc or square; and/or the barrier blocks comprise a cross-sectional shape that is triangular, square, or trapezoidal.

14. The display device according to claim 9, wherein a material of the barrier blocks comprises silicon oxide or silicon nitride; and/or a material of the substrate is polyimide.

15. The display device according to claim 9, wherein a shape of the trench in a plan view is linear or wavy.

* * * * *